United States Patent
Moriasa et al.

(10) Patent No.: US 11,703,040 B2
(45) Date of Patent: Jul. 18, 2023

(54) PUMP AND COOLING SUBSTRATE

(71) Applicant: Murata Manufacturing Co., Ltd., Nagaokakyo (JP)

(72) Inventors: Takafumi Moriasa, Nagaokakyo (JP); Shuichi Kawata, Nagaokakyo (JP); Masahiko Shigaki, Nagaokakyo (JP); Yuichi Kusano, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 36 days.

(21) Appl. No.: 17/187,921

(22) Filed: Mar. 1, 2021

(65) Prior Publication Data

US 2021/0180882 A1    Jun. 17, 2021

Related U.S. Application Data

(63) Continuation of application No. PCT/JP2019/038613, filed on Sep. 30, 2019.

(30) Foreign Application Priority Data

Oct. 3, 2018  (JP) .................................. 2018-188012

(51) Int. Cl.
*F28F 3/12* (2006.01)
*H01L 23/473* (2006.01)
(Continued)

(52) U.S. Cl.
CPC .......... *F04B 19/006* (2013.01); *H01L 23/473* (2013.01)

(58) Field of Classification Search
CPC .............................. F04B 19/006; H01L 23/473
See application file for complete search history.

(56) References Cited

U.S. PATENT DOCUMENTS

| 2003/0143081 A1* | 7/2003 | Rakestraw | F04B 17/00 417/48 |
| 2005/0230080 A1* | 10/2005 | Paul | G06F 1/20 165/47 |

(Continued)

FOREIGN PATENT DOCUMENTS

| JP | 2007-533170 A | 11/2007 |
| JP | 2014-523499 A | 9/2014 |
| JP | 6166268 B2 | 7/2017 |

OTHER PUBLICATIONS

Official Communication issued in International Patent Application No. PCT/JP2019/038613, dated Dec. 17, 2019.

*Primary Examiner* — Connor J Tremarche
(74) *Attorney, Agent, or Firm* — Keating & Bennett, LLP

(57) ABSTRACT

A pump includes a pump flow path and electrodes and dielectric members in the pump flow path to allow a fluid to pass through the electrodes and the dielectric members in a flowing direction. The electrodes and the dielectric members are alternately stacked in the flowing direction so that a dielectric member is located between adjacent electrodes. Among the electrodes, an inter-electrode polarity of each pair of electrodes is different from that of an adjacent pair of electrodes. The dielectric members include a first dielectric member at a position of an odd-numbered dielectric member counted from the most upstream side of the flowing direction and a second dielectric member at a position of an even-numbered dielectric member counted from the most upstream side of the flowing direction. Material of the first and second dielectric members provide signs of a zeta potential opposite to each other.

9 Claims, 9 Drawing Sheets

(51) Int. Cl.
*F04B 19/00* (2006.01)
*F28F 9/22* (2006.01)

(56) References Cited

U.S. PATENT DOCUMENTS

| | | | |
|---|---|---|---|
| 2012/0282111 A1* | 11/2012 | Nip | F04B 43/04 |
| | | | 417/48 |
| 2013/0153797 A1* | 6/2013 | Puleo | F16K 99/0059 |
| | | | 251/12 |
| 2016/0252082 A1 | 9/2016 | Okumura et al. | |

* cited by examiner

PUMP AND COOLING SUBSTRATE

CROSS REFERENCE TO RELATED APPLICATIONS

This application claims the benefit of priority to Japanese Patent Application No. 2018-188012 filed on Oct. 3, 2018 and is a Continuation Application of PCT Application No. PCT/JP2019/038613 filed on Sep. 30, 2019. The entire contents of each application are hereby incorporated herein by reference.

BACKGROUND OF THE INVENTION

1. Field of the Invention

The present invention relates to a pump using an electroosmotic flow and to a cooling substrate including a pump.

2. Description of the Related Art

Japanese Patent No. 6166268 discloses a pump using an electroosmotic flow. The pump includes a dielectric porous film, a first water-permeable electrode disposed on one side of the dielectric porous film, and a second water-permeable electrode disposed on the other side of the dielectric porous film.

The flow rate of the above-described pump is proportional to the sectional area of the dielectric porous film in the flowing direction of a fluid and is inversely proportional to the thickness (that is, the dimension in the flowing direction of a fluid) of the dielectric porous film. To enhance the flow rate of the pump, the sectional area of the dielectric porous film may be increased or the thickness thereof may be decreased.

However, increasing the sectional area of the dielectric porous film makes the pump larger, which makes it difficult to integrate the pump into a substrate, for example, while decreasing the thickness of the dielectric porous film makes it difficult to secure the mechanical strength of the pump. With the use of the above-described pump, it may thus be difficult to improve the flow rate while ensuring the mechanical strength.

SUMMARY OF THE INVENTION

Preferred embodiments of the present invention provide pumps each using an electroosmotic flow that each improve the flow rate while ensuring the mechanical strength, and cooling substrates each including such pumps.

A pump according to a preferred embodiment of the present invention includes a pump flow path through which a fluid flows and a plurality of electrodes and a plurality of dielectric members that are disposed in the pump flow path so as to allow a fluid to pass through the plurality of electrodes and the plurality of dielectric members in a flowing direction of the fluid. The plurality of electrodes and the plurality of dielectric members are alternately stacked in contact with each other in the flowing direction so that, among the plurality of dielectric members, a dielectric member is located between adjacent electrodes of the plurality of electrodes. Among the plurality of electrodes, an inter-electrode polarity of each pair of electrodes is different from an inter-electrode polarity of an adjacent pair of electrodes. The plurality of dielectric members include a first dielectric member disposed at a position of an odd-numbered dielectric member counted from the most upstream side of the flowing direction and a second dielectric member disposed at a position of an even-numbered dielectric member counted from the most upstream side of the flowing direction. A material from which the first dielectric member is made and a material from which the second dielectric member is made are materials that make a sign of a zeta potential of the first dielectric member in the flowing direction and a sign of a zeta potential of the second dielectric member in the flowing direction opposite to each other.

A pump according to a preferred embodiment of the present invention includes a pump flow path through which a fluid flows and a plurality of electrodes and a plurality of dielectric members that are disposed in the pump flow path so as to allow a fluid to pass through the plurality of electrodes and the plurality of dielectric members in a flowing direction of the fluid. The plurality of electrodes and the plurality of dielectric members are alternately stacked in contact with each other in the flowing direction so that, among the plurality of dielectric members, a dielectric member is located between adjacent electrodes of the plurality of electrodes. Among the plurality of electrodes, an inter-electrode polarity of each pair of electrodes is different from an inter-electrode polarity of an adjacent pair of electrodes. The plurality of dielectric members include a first dielectric member disposed at a position of an odd-numbered dielectric member counted from the most upstream side of the flowing direction and a second dielectric member disposed at a position of an even-numbered dielectric member counted from the most upstream side of the flowing direction. A material from which the first dielectric member is made and a material from which the second dielectric member is made are materials that make a sign of a zeta potential of the first dielectric member in the flowing direction and a sign of a zeta potential of the second dielectric member in the flowing direction identical or substantially identical to each other and that make an absolute value of the zeta potential of the first dielectric member in the flowing direction become greater than an absolute value of the zeta potential of the second dielectric member in the flowing direction.

A pump according to a preferred embodiment of the present invention includes a pump flow path through which a fluid flows and a plurality of electrodes and a plurality of dielectric members that are disposed in the pump flow path so as to allow a fluid to pass through the plurality of electrodes and the plurality of dielectric members in a flowing direction of the fluid. The plurality of electrodes and the plurality of dielectric members are alternately stacked in contact with each other in the flowing direction so that, among the plurality of dielectric members, a dielectric member is located between adjacent electrodes of the plurality of electrodes. Among the plurality of electrodes, an inter-electrode polarity of each pair of electrodes is different from an inter-electrode polarity of an adjacent pair of electrodes. The plurality of dielectric members include a first dielectric member disposed at a position of an odd-numbered dielectric member counted from the most upstream side of the flowing direction and a second dielectric member disposed at a position of an even-numbered dielectric member counted from the most upstream side of the flowing direction. A porosity of the second dielectric member in the flowing direction is greater than a porosity of the first dielectric member in the flowing direction.

A pump according to a preferred embodiment of the present invention includes a pump flow path through which a fluid flows and a plurality of electrodes and a plurality of dielectric members that are disposed in the pump flow path so as to allow a fluid to pass through the plurality of electrodes and the plurality of dielectric members in a flowing direction of the fluid. The plurality of electrodes and the plurality of dielectric members are alternately stacked in contact with each other in the flowing direction so that, among the plurality of dielectric members, a dielectric member is located between adjacent electrodes of the plurality of electrodes. Among the plurality of electrodes, an inter-electrode polarity of each pair of electrodes is different from an inter-electrode polarity of an adjacent pair of electrodes. The plurality of dielectric members include a first dielectric member disposed at a position of an odd-numbered dielectric member counted from the most upstream side of the flowing direction and a second dielectric member disposed at a position of an even-numbered dielectric member counted from the most upstream side of the flowing direction. A pore size of the second dielectric member in the flowing direction is greater than a pore size of the first dielectric member in the flowing direction.

A pump according to a preferred embodiment of the present invention includes a pump flow path through which a fluid flows and a plurality of electrodes and a plurality of dielectric members that are disposed in the pump flow path so as to allow a fluid to pass through the plurality of electrodes and the plurality of dielectric members in a flowing direction of the fluid. The plurality of electrodes and the plurality of dielectric members are alternately stacked in contact with each other in the flowing direction so that, among the plurality of dielectric members, a dielectric member is located between adjacent electrodes of the plurality of electrodes. Among the plurality of electrodes, an inter-electrode polarity of each pair of electrodes is different from an inter-electrode polarity of an adjacent pair of electrodes. The plurality of dielectric members include a first dielectric member disposed at a position of an odd-numbered dielectric member counted from the most upstream side of the flowing direction and a second dielectric member disposed at a position of an even-numbered dielectric member counted from the most upstream side of the flowing direction. A tortuosity of the second dielectric member in the flowing direction is smaller than a tortuosity of the first dielectric member in the flowing direction.

A cooling substrate according to a preferred embodiment of the present invention includes a substrate flow path and a pump according to a preferred embodiment of the present invention. The fluid fills the substrate flow path and flows through it. The pump is disposed in the substrate flow path, and the pump flow path is connected to the substrate flow path.

In a pump according to a preferred embodiment of the present invention, the first dielectric member and the second dielectric member are made of materials which make the sign of the zeta potential of the first dielectric member and that of the second dielectric member in the flowing direction A opposite to each other. This configuration makes it possible to generate the drive force acting in the same direction as the flowing direction in all of the layers of the plurality of dielectric members, thus increasing the flow rate of the pump. It is thus possible to provide pumps each using an electroosmotic flow that are each able to improve the flow rate while ensuring the mechanical strength.

In a pump according to a preferred embodiment of the present invention, the first dielectric member and the second dielectric member are made of materials which make the sign of the zeta potential of the first dielectric member and that of the second dielectric member in the flowing direction A identical or substantially identical to each other and that make the absolute value of the zeta potential of the first dielectric member in the flowing direction become greater than that of the second dielectric member in the flowing direction. With this configuration, the drive force acting in the flowing direction becomes greater than that in the direction opposite the flowing direction, thus increasing the flow rate of the pump. It is thus possible to provide pumps each using an electroosmotic flow that are each able to improve the flow rate while ensuring the mechanical strength.

In a pump according to a preferred embodiment of the present invention, the porosity of the second dielectric member in the flowing direction is greater than that of the first dielectric member in the flowing direction, or the pore size of the second dielectric member in the flowing direction is greater than that of the first dielectric member in the flowing direction, or the tortuosity of the second dielectric member in the flowing direction is smaller than that of the first dielectric member in the flowing direction. With this configuration, the flow rate of the pump can become greater than that of a pump including one dielectric member and a pair of electrodes at both ends of the dielectric member. It is thus possible to provide pumps each using an electroosmotic flow that are each able to improve the flow rate while ensuring the mechanical strength.

The cooling substrates according to preferred embodiments of the present invention each achieve a high heat dissipation efficiency by including a pump according to a preferred embodiment of the present invention.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
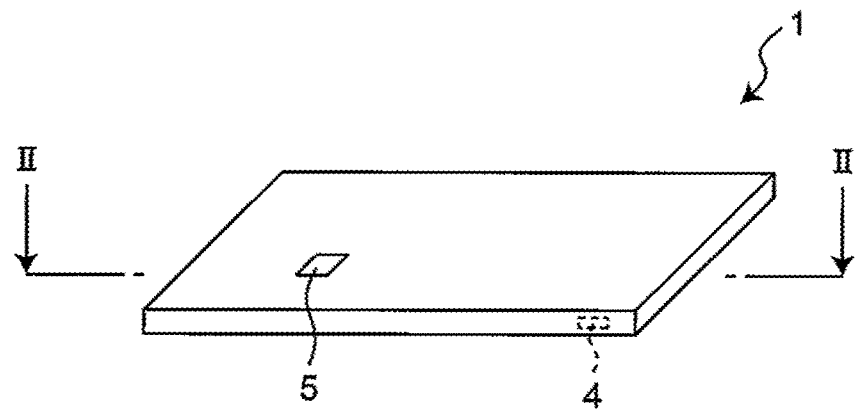
FIG. 1 is a perspective view illustrating a cooling substrate according to a first preferred embodiment of the present invention.

A pump according to a preferred embodiment of the present invention includes a pump flow path through which a fluid flows and a plurality of electrodes and a plurality of dielectric members that are disposed in the pump flow path so as to allow a fluid to pass through the plurality of electrodes and the plurality of dielectric members in a flowing direction of the fluid. The plurality of electrodes and the plurality of dielectric members are alternately stacked in contact with each other in the flowing direction so that, among the plurality of dielectric members, a dielectric member is located between adjacent electrodes of the plurality of electrodes. Among the plurality of electrodes, an inter-electrode polarity of each pair of electrodes is different from an inter-electrode polarity of an adjacent pair of electrodes. The plurality of dielectric members include a first dielectric member disposed at a position of an odd-numbered dielectric member counted from the most upstream side of the flowing direction and a second dielectric member disposed at a position of an even-numbered dielectric member counted from the most upstream side of the flowing direction. A material from which the first dielectric member is made and a material from which the second dielectric member is made are materials that make a sign of a zeta potential of the first dielectric member in the flowing direction and a sign of a zeta potential of the second dielectric member in the flowing direction opposite to each other.

In the above-described pump, the first dielectric member and the second dielectric member are made of materials which make the sign of the zeta potential of the first dielectric member and that of the second dielectric member in the flowing direction opposite to each other. With this configuration, the drive force acting in the flowing direction becomes greater than that in the direction opposite the flowing direction, thus increasing the flow rate of the pump. It is thus possible to provide a pump using an electroosmotic flow that can improve the flow rate while ensuring the mechanical strength.

A pump according to a preferred embodiment of the present invention includes a pump flow path through which a fluid flows and plurality of electrodes and plurality of dielectric members that are disposed in the pump flow path so as to allow a fluid to pass through the plurality of electrodes and the plurality of dielectric members in a flowing direction of the fluid. The plurality of electrodes and the plurality of dielectric members are alternately stacked in contact with each other in the flowing direction so that, among the plurality of dielectric members, a dielectric member is located between adjacent electrodes of the plurality of electrodes. Among the plurality of electrodes, an inter-electrode polarity of each pair of electrodes is different from an inter-electrode polarity of an adjacent pair of electrodes. The plurality of dielectric members include a first dielectric member disposed at a position of an odd-numbered dielectric member counted from the most upstream side of the flowing direction and a second dielectric member disposed at a position of an even-numbered dielectric member counted from the most upstream side of the flowing direction. A material from which the first dielectric member is made and a material from which the second dielectric member is made are materials that make a sign of a zeta potential of the first dielectric member in the flowing direction and a sign of a zeta potential of the second dielectric member in the flowing direction identical or substantially identical to each other and that make an absolute value of the zeta potential of the first dielectric member in the flowing direction become greater than an absolute value of the zeta potential of the second dielectric member in the flowing direction.

In the above-described pump, the first dielectric member and the second dielectric member are made of materials which make the sign of the zeta potential of the first dielectric member and that of the second dielectric member in the flowing direction identical or substantially identical to each other and that make the absolute value of the zeta potential of the first dielectric member in the flowing direction become greater than that of the second dielectric member in the flowing direction. With this configuration, the drive force acting in the flowing direction becomes greater than that in the direction opposite the flowing direction, thus increasing the flow rate of the pump. It is thus possible to provide a pump using an electroosmotic flow that can improve the flow rate while ensuring the mechanical strength.

In a pump according to a preferred embodiment of the present invention, the fluid is water.

In this pump, water having a higher heat capacity than other solvents, such as oil, is used as the fluid. When this pump is used for cooling, it achieve a higher cooling effect than a pump using another solvent, such as oil.

In a pump according to a preferred embodiment of the present invention, the fluid is water to which an additive is added.

In this pump, water with an additive is used as the fluid. Various characteristics, such as the electrical conductivity and the zeta potential, of the fluid can be adjusted, which makes it possible to achieve a greater flowing drive force.

In a pump according to a preferred embodiment of the present invention, the fluid is any of a buffer solution, an antifreeze, and a corrosion resistant agent.

A pump according to a preferred embodiment of the present invention includes a pump flow path through which a fluid flows and plurality of electrodes and plurality of dielectric members that are disposed in the pump flow path so as to allow a fluid to pass through the plurality of electrodes and the plurality of dielectric members in a flowing direction of the fluid. The plurality of electrodes and the plurality of dielectric members are alternately stacked in contact with each other in the flowing direction so that, among the plurality of dielectric members, a dielectric member is located between adjacent electrodes of the plurality of electrodes. Among the plurality of electrodes, an inter-electrode polarity of each pair of electrodes is different from an inter-electrode polarity of an adjacent pair of electrodes. The plurality of dielectric members include a first dielectric member disposed at a position of an odd-numbered dielectric member counted from the most upstream side of the flowing direction and a second dielectric member disposed at a position of an even-numbered dielectric member counted from the most upstream side of the flowing direction. A porosity of the second dielectric member in the flowing direction is greater than a porosity of the first dielectric member in the flowing direction.

In the above-described pump, the porosity of the second dielectric member in the flowing direction is greater than that of the first dielectric member in the flowing direction. With this configuration, the flow rate of the pump can become greater than that of a pump including one dielectric member and a pair of electrodes at both ends of the dielectric member. It is thus possible to provide a pump using an electroosmotic flow that can improve the flow rate while ensuring the mechanical strength.

A pump according to a preferred embodiment of the present invention includes a pump flow path through which a fluid flows and plurality of electrodes and plurality of dielectric members that are disposed in the pump flow path so as to allow a fluid to pass through the plurality of electrodes and the plurality of dielectric members in a flowing direction of the fluid. The plurality of electrodes and the plurality of dielectric members are alternately stacked in contact with each other in the flowing direction so that, among the plurality of dielectric members, a dielectric member is located between adjacent electrodes of the plurality of electrodes. Among the plurality of electrodes, an inter-electrode polarity of each pair of electrodes is different from an inter-electrode polarity of an adjacent pair of electrodes. The plurality of dielectric members include a first dielectric member disposed at a position of an odd-numbered dielectric member counted from the most upstream side of the flowing direction and a second dielectric member disposed at a position of an even-numbered dielectric member counted from the most upstream side of the flowing direction. A pore size of the second dielectric member in the flowing direction is greater than a pore size of the first dielectric member in the flowing direction.

In the above-described pump, the pore size of the second dielectric member in the flowing direction is greater than that of the first dielectric member in the flowing direction. With this configuration, the flow rate of the pump can become greater than that of a pump including one dielectric member and a pair of electrodes at both ends of the dielectric member. It is thus possible to provide a pump using an electroosmotic flow that can improve the flow rate while ensuring the mechanical strength.

A pump according to a preferred embodiment of the present invention includes a pump flow path through which a fluid flows and plurality of electrodes and plurality of dielectric members that are disposed in the pump flow path so as to allow a fluid to pass through the plurality of electrodes and the plurality of dielectric members in a flowing direction of the fluid. The plurality of electrodes and the plurality of dielectric members are alternately stacked in contact with each other in the flowing direction so that, among the plurality of dielectric members, a dielectric member is located between adjacent electrodes of the plurality of electrodes. Among the plurality of electrodes, an inter-electrode polarity of each pair of electrodes is different from an inter-electrode polarity of an adjacent pair of electrodes. The plurality of dielectric members include a first dielectric member disposed at a position of an odd-numbered dielectric member counted from the most upstream side of the flowing direction and a second dielectric member disposed at a position of an even-numbered dielectric member counted from the most upstream side of the flowing direction. A tortuosity of the second dielectric member in the flowing direction is smaller than a tortuosity of the first dielectric member in the flowing direction.

In the above-described pump, the tortuosity of the second dielectric member in the flowing direction is smaller than that of the first dielectric member in the flowing direction. With this configuration, the flow rate of the pump can become greater than that of a pump including one dielectric member and a pair of electrodes at both ends of the dielectric member. It is thus possible to provide a pump using an electroosmotic flow that can improve the flow rate while ensuring the mechanical strength.

In the above-described pumps, a thickness of each of the plurality of electrodes in the flowing direction may be larger than a thickness of each of the plurality of dielectric members in the flowing direction.

With this configuration, the mechanical strength of the pump can be even further improved.

In a pump according to a preferred embodiment of the present invention, preferably the first dielectric member is made of $SiO_2$ and the second dielectric member is made of $Al_2O_3$, or the first dielectric member is made of $TiO_2$ and the second dielectric member is made of $Al_2O_3$, or the first dielectric member is made of $SiO_2$ and the second dielectric member is made of $TiO_2$, or the first dielectric member is made of $SiO_2$ and the second dielectric member is made of $ZrO_2$, or the first dielectric member is made of $ZrO_2$ and the second dielectric member is made of $Al_2O_3$, or the first dielectric member is made of polytetrafluoroethylene and the second dielectric member is made of polyethylene terephthalate, for example.

In this pump, the first dielectric member and the second dielectric member are defined by a combination of different types of oxide ceramics. Thus, a typical manufacturing method using electronic ceramics can be used. It is thus possible to provide mass-producible pumps with a low cost.

A cooling substrate according to a preferred embodiment of the present invention includes a substrate flow path and a pump according to a preferred embodiment of the present invention. The fluid fills the substrate flow path and flows through it. The pump is disposed in the substrate flow path, and the pump flow path is connected to the substrate flow path.

This cooling substrate achieves a high heat dissipation efficiency by including pump.

In the above-described cooling substrate, the pump may have a rectangular-parallelepiped shape including three sides whose lengths are different from each other, and the substrate flow path may include a positioning recessed portion that stores the pump therein and determines the position of the pump.

With this configuration, the pump can be easily disposed in the substrate flow path.

Preferred embodiments of the present invention will be described below with reference to the accompanying drawings. In the following description, the terms representing specific directions and positions (such as "top", "bottom", "right", and "left") are used if necessary, but they are used only for facilitating the understanding of the present disclosure with the use of the drawings and are not intended to restrict the technical scope of the disclosure. The following description is merely an example and is not intended to limit the disclosure and applications and purposes of the disclosure. The drawings are only schematically shown, and the dimensional ratio of each component and the dimensional ratio of one component to that of another component shown in the drawings do not necessarily match the actual ratios.

First Preferred Embodiment

Figure 2:
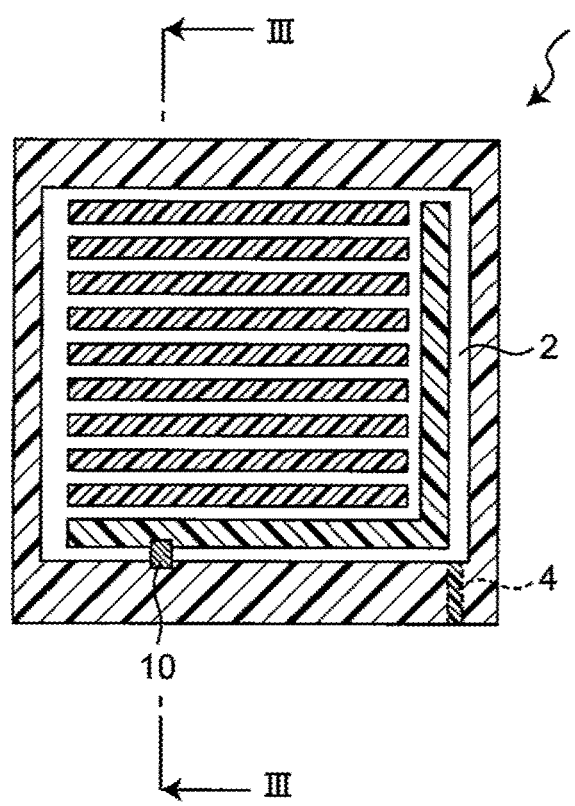
FIG. 2 is a sectional view taken along line II-II in FIG. 1.
Figure 3:
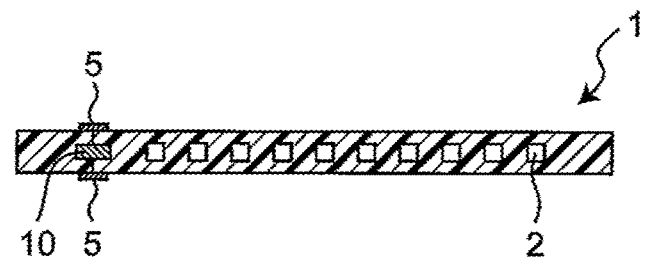
FIG. 3 is a sectional view taken along line III-III in FIG. 2.

A cooling substrate 1 according to a first preferred embodiment of the present invention has a planar or substantially planar quadrilateral shape and is preferably made of Si (silicon), for example. As shown in FIGS. 1 through 3, the cooling substrate 1 includes a substrate flow path 2 through which a fluid flows and a pump 10 using an electroosmotic flow disposed in the substrate flow path 2.

The dimensions of the cooling substrate 1 are preferably as follows, for example: the thickness is about 0.1 mm to about 0.8 mm and the length of each side of the planar shape is about 20 mm. The material for the cooling substrate 1 is not limited to Si, and ceramics, for example, may be used.

As a fluid, for example, water, a buffer solution, a mixed solution of water and an antifreeze, and a mixed solution of water and a corrosion resistant agent may be used.

Water preferably has a pH4 to pH9, and more preferably, a pH7 (=pure water), for example. Water may include an electrolyte, such as KCl, for example.

The buffer solution is an aqueous solution including weak acid or weak base and its chlorides. Examples of the buffer solution are a phosphate buffer solution, a citrate buffer solution, a tris buffer solution, an acetic acid buffer solution, a McIlvaine buffer solution, a HEPES buffer solution, a boric acid buffer solution, a MOPS buffer solution, and a Good's buffer solution. The zeta potential may vary depending on the pH of a fluid. If the pH of a fluid is changed due to electrolysis in electrodes 12, for example, the zeta potential may be varied. This may change the flow rate Q of the pump 10, as expressed by the below-described equation 1, and the pumping efficiency of the pump 10 may be reduced accordingly. Using a buffer solution whose pH is less likely to change as a fluid can prevent a decrease in the pumping efficiency of the pump 10.

The antifreeze includes glycols such as ethylene glycol and propylene glycol and alcohols such as methanol and ethanol, for example. If water is used as a fluid, adding an antifreeze to water can drop the freezing point of the fluid. As a greater amount of antifreeze is added, the freezing point of water can become lower.

The corrosion resistant agent includes phosphate, borate, silicate, organic acids, and nitrite, for example. If a pump flow path 11 or the electrodes 12 is made of a metal material, it may be corroded while being in contact with water for a long time. If water is used as a fluid, adding a corrosion resistant agent to water can prevent the corrosion of the pump flow path 11 or the electrodes 12 made of a metal material.

Figure 4:
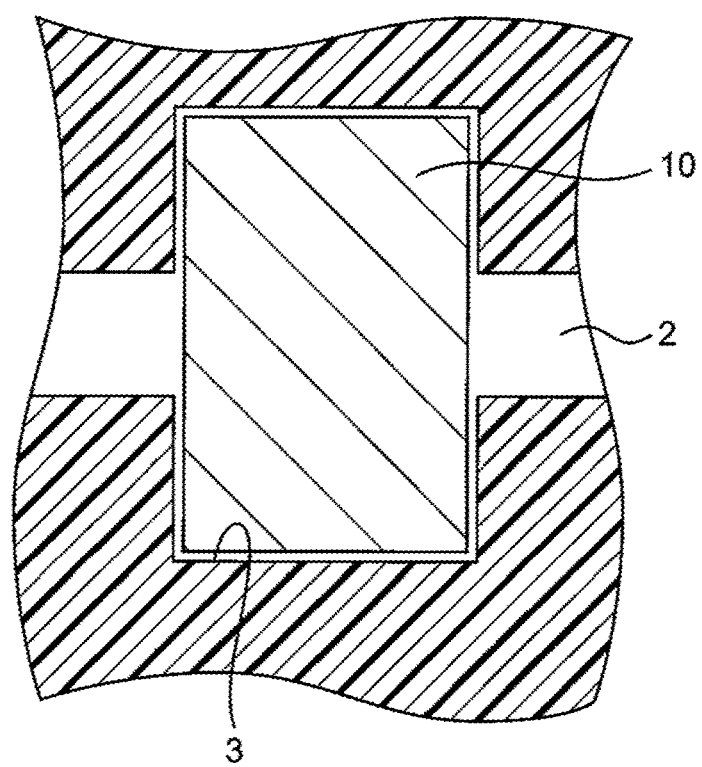
FIG. 4 is a sectional enlarged view of a portion around a pump in FIG. 2.

The substrate flow path 2 is disposed inside the cooling substrate 1. Circulating a fluid in the substrate flow path 2 can substantially cool the entirety of the planar surfaces of the cooling substrate 1. As shown in FIG. 4, the substrate flow path 2 includes a positioning portion 3 that stores the pump 10 therein and determines the position of the pump 10. The dimensions of the substrate flow path 2 are preferably as follows, for example: the width is about 500 μm and the height is about 340 μm.

As shown in FIG. 2, a fluid supply path 4 is provided inside the cooling substrate 1 and is connected between the substrate flow path 2 and the exterior of the cooling substrate 1. A fluid is supplied to the substrate flow path 2 and fills it via the fluid supply path 4. After a fluid has filled the substrate flow path 2, the fluid supply path 4 is sealed so that the fluid in the substrate supply path 2 does not leak to the exterior of the cooling substrate 1.

As shown in FIG. 3, a pair of extracting electrodes 5 connected to the pump 10 are provided on the planar surfaces of the cooling substrate 1. The pump 10 and a power supply 100 (see FIG. 5) are connected to each other via the pair of extracting electrodes 5.

Figure 5:
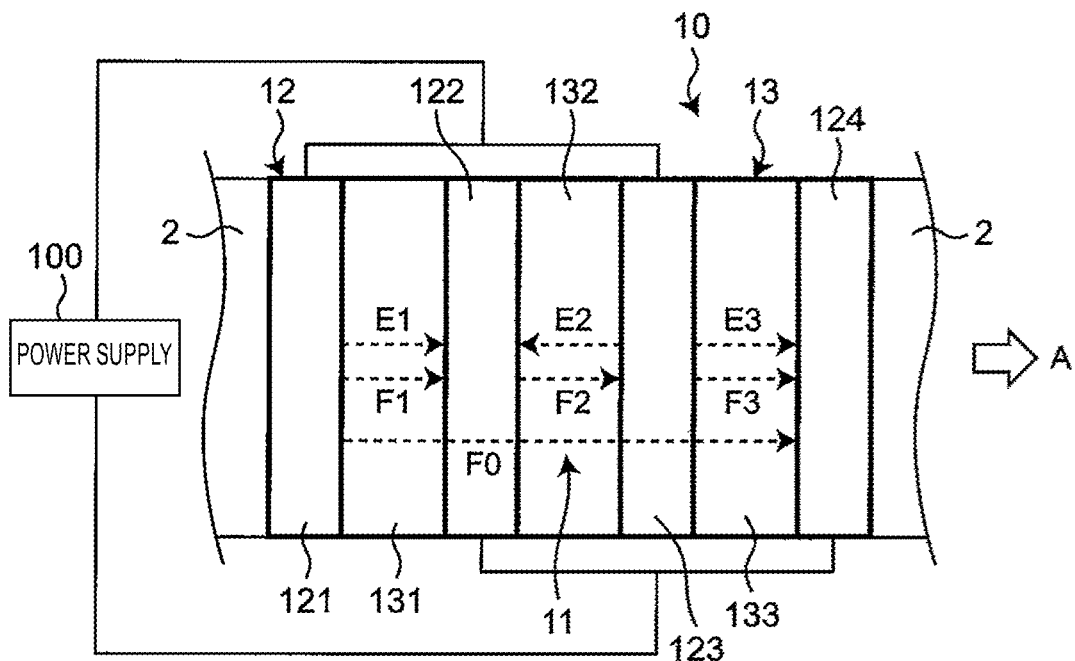
FIG. 5 is a schematic view illustrating a pump according to the first preferred embodiment of the present invention.

The pump 10 has a rectangular-parallelepiped shape including three sides whose lengths are different from each other. As shown in FIG. 5, the pump 10 includes a pump flow path 11 through which a fluid flows, multiple electrodes 12, and multiple dielectric members 13. The electrodes 12 and the dielectric members 13 are disposed in the pump flow path 11 so as to allow a fluid to pass therethrough in the flowing direction of the fluid (in other words, the extending direction of the pump flow path 11).

The dimensions of the pump 10 are preferably as follows, for example: the length of one of the three sides is about 0.1 mm to about 0.8 mm (about 320 μm, for example) and the lengths of the remaining two sides are about 0.1 mm to about 1.0 mm (about 700 μm and about 860 μm, for example).

As shown in FIG. 5, the pump flow path 11 is in a shape of a straight or substantially straight line extending in the direction indicated by the arrow A, and both ends in this extending direction are connected to the substrate flow path 2. That is, the pump flow path 11 is configured such that a fluid filling the substrate flow path 2 flows in the extending direction. The pump flow path 11 may not necessarily be in the shape of a straight or substantially straight line and may have a curved shape or the intermediate portion thereof may be bent.

The plurality of electrodes 12 and the plurality of dielectric members 13 are alternately stacked in contact with each other in the flowing direction of a fluid so that a dielectric member 13 is located between adjacent electrodes 12. The electrodes 12 are made of a porous conductive material preferably having a thickness (that is, the dimension in the direction indicated by the arrow A) of about 1 μm, for example. The dielectric members are made of porous ceramics preferably having a thickness of about 20 μm, for example. As the porous conductive material, a metal material, such as, for example, Pt, Cu, Ag, Au, and Ni, can be used. As the porous ceramics, $SiO_2$, $Al_2O_3$, $ZrO_2$, $TiO_2$, and $BaTiO_3$, for example, can be used.

Instead of porous materials, each electrode 12 and each dielectric member 13 may be made of a non-porous material. In this case, for example, a plurality of through-holes extending in the flowing direction of a fluid are provided in each electrode 12 and each dielectric member 13.

In the first preferred embodiment, the pump 10 includes four electrodes 121, 122, 123, and 124 (hereinafter respectively referred to as a first electrode 121, a second electrode 122, a third electrode 123, and a fourth electrode 124 in order of the upstream to downstream side of the flowing direction of a fluid) and three dielectric members 131, 132, and 133 (hereinafter respectively referred to as a first dielectric member 131, a second dielectric member 132, and a third dielectric member 133 in order of the upstream to downstream side of the flowing direction of a fluid). The electrodes 121, 122, 123, and 124 are disposed at equal or substantially equal spacings in the direction indicated by the arrow A.

The first electrode 121 and the third electrode 123 are connected to an input terminal of a DC or AC power supply 100, while the second electrode 122 and the fourth electrode 124 are connected to an output terminal of the power supply 100. Among the multiple electrodes 121, 122, 123, and 124, the inter-electrode polarity of each pair of electrodes is different from that of an adjacent pair of electrodes. For example, an electric field E1 in the direction indicated by the arrow A is generated between the first electrode 121 and the second electrode 122, an electric field E2 in the direction opposite to that indicated by the arrow A is generated between the second electrode 122 and the third electrode 123, and an electric field E3 in the direction indicated by the arrow A is generated between the third electrode 123 and the fourth electrode 124.

As described above, the pump 10 of the first preferred embodiment includes the multiple electrodes 12 and the multiple dielectric members 13 that are disposed in the pump flow path 11 so as to allow a fluid to pass through the electrodes 12 and the dielectric members 13 in the flowing direction of the fluid. The multiple electrodes 12 and the multiple dielectric members 13 are alternately stacked in contact with each other in the flowing direction of the fluid so that, among the plurality of dielectric members 13, a dielectric member is located between adjacent electrodes of the plurality of electrodes 12. With this configuration, even with a reduced thickness of each dielectric member 13, the mechanical strength of the pump 10 can be ensured. It is thus possible to provide a pump using an electroosmotic flow that can improve the flow rate while ensuring the mechanical strength.

If each of the electrodes 121, 122, 123, and 124 has a thickness in the flowing direction A larger than each of the dielectric members 131, 132, and 133, the mechanical strength of the pump 10 can be even further improved.

The flow rate Q of a pump using an electroosmotic flow can be calculated according to the following equation 1.

$$Q = -\frac{\psi A}{\mu L \tau}\left(\varepsilon \zeta V\left(1 - \frac{2\lambda I_1(\alpha/\lambda)}{\alpha I_0(\alpha/\lambda)}\right) - \frac{\Delta P \alpha^2}{8}\right) \quad \text{Equation 1}$$

In the above-described equation 1, A is the sectional area [m$^2$] of the dielectric member perpendicular or substantially perpendicular to the flowing direction, L is the average pore size [m] of the porous dielectric member, ε is the dielectric constant [C/V·m] of a solution, μ is the viscosity [Pa·s] of the solution, ζ is the zeta potential [V], λ is the Debye length [m], $I_1$ is the first-order modified Bessel function, $I_0$ is the 0th-order modified Bessel function, ΔP is the pressure gradient [Pa], and V is the applied voltage [V].

When the pressure gradient ΔP is 0, the flow rate Q is proportional to the product of the electric field strength E (=V/L) and the zeta potential ζ. It is thus assumed that, in the pump 10, the drive force F proportional to the product of the electric field strength E (=V/L) and the zeta potential ζ is generated, and the drive force F is defined as F=kEζ (k is a constant of proportionality).

The following pump 10 is now described. The pump 10 has a total length of L in the flowing direction A and n (n is a natural number) dielectric members having the same or substantially the same thickness are stacked on each other (the thicknesses of electrodes are ignored). It is now assumed that, in a state in which a fluid is flowing through the pump flow path 11, the zeta potential of the odd-numbered dielectric member (in the present preferred embodiment, the first dielectric member 131 and the third dielectric member 133, which will be referred to as a first dielectric member) in the flowing direction A is ζ1, while the zeta potential of the even-numbered dielectric member (in the present preferred embodiment, the second dielectric member 132, which will be referred to as a second dielectric member) in the flowing direction A is ζ2. In this case, a material from which the first dielectric member is made and a material from which the second dielectric member is made are materials that make the zeta potential of the first dielectric member and that of the second dielectric member satisfy ζ2=−ζ1. In other words, the material from which the first dielectric member is made and the material from which the second dielectric member is made are materials that make the sign of the zeta potential of the first dielectric member and that of the second dielectric member opposite to each other.

Figure 6:
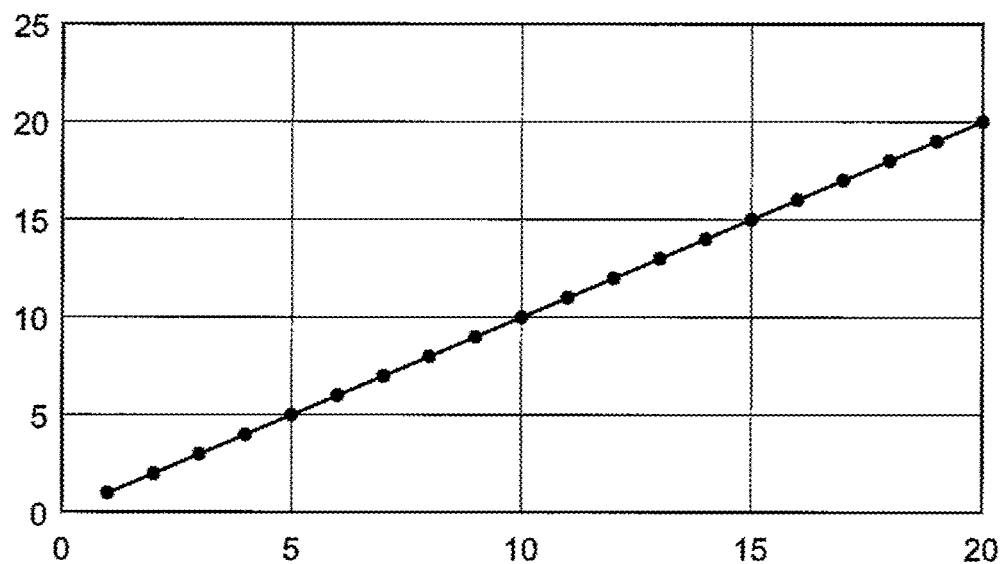
FIG. 6 is a graph illustrating the relationship between the stacking number of pumps shown in FIG. 5 and the relative value of a drive force.

When the voltage applied to an odd-numbered dielectric member counted from the most upstream side of the flowing direction A is V, the voltage applied to an even-numbered dielectric member counted from the most upstream side of the flowing direction A is −V. Thus, the electric field E1 generated in the first dielectric member is E1=V/(L/n)=nV/L, while the electric field E2 generated in the second dielectric member is E2=−V/(L/n)=−nV/L. According to the definition of F=kEζ, the drive force F1 generated in the first dielectric member is F1=knVζ/L and the drive force F2 generated in the second dielectric member is F2=knVζ/L, and thus, F1=F2. Additionally, since F1 and F2 are proportional to n, the drive force F is elevated as the stacking number n of dielectric members is greater, as shown in FIG. 6. In this manner, the first dielectric member and the second dielectric member, which are made of materials that make the sign of the zeta potential of the first dielectric member and that of the second dielectric member opposite to each other, are alternately stacked on each other. This elevates the drive force F generated proportionally to the stacking number n of dielectric members and accordingly increases the flow rate Q of the pump 10. In FIG. 6, F is represented by the relative value, assuming that the average of the drive force F in the entire pump 10 is 1 when the stacking number n is 1.

That is, in the pump 10 of the first preferred embodiment, if the electric charge in the electrical double layer of each of the first dielectric member 131 and the third dielectric member 133 is positive, the electric charge of the second dielectric member 132 becomes negative. In the second dielectric member 132, the electric field E2 generated in the direction opposite the flowing direction A acts on the negative electric charge in the electrical double layer, and thus, the drive force F2 generated in the second dielectric member 132 acts in the same positive direction as the flowing direction A, as shown in FIG. 5. The first and third dielectric members 131 and 133 and the second dielectric member 132 are made of materials which make the sign of the zeta potential of the first and third dielectric members 131 and 133 and that of the second dielectric member 132 in the flowing direction A opposite to each other. This can generate the drive force F acting in the same direction as the flowing direction A in all of the layers of the first dielectric member 131, the second dielectric member 132, and the third dielectric member 133, thus increasing the flow rate of the pump 10. As a result, it is possible to provide the pump 10 using an electroosmotic flow that can improve the flow rate while ensuring the mechanical strength.

Similar advantages can also be obtained if the first and second dielectric members are made of materials which make the zeta potential of the first dielectric member and that of the second dielectric member have the same sign and which make the absolute value of the zeta potential of the first dielectric member greater than that of the second dielectric member.

By using the pump 10, the cooling substrate 1 achieves a high heat dissipation efficiency.

In the cooling substrate 1, the pump 10 preferably has a rectangular-parallelepiped shape including three sides whose lengths are different from each other, and the substrate flow path includes the positioning portion 3 that stores the pump 10 therein and determines the position of the pump 10. With this configuration, it is possible to determine the position of the pump 10 with respect to the cooling substrate 1 while determining the orientation of the pump 10 with respect to the substrate flow path 2.

In FIG. 5, it is assumed that the potential of the first electrode 121 and the third electrode 123 is positive and the potential of the second potential 122 is negative. In this case, the first dielectric member 131 and the third dielectric member 133 (that is, the first dielectric member) and the second dielectric member 132 (that is, the second dielectric member) are preferably made of the following materials, for example.

first dielectric member: $SiO_2$, second dielectric member: $Al_2O_3$ first dielectric member: $TiO_2$, second dielectric member: $Al_2O_3$ first dielectric member: $SiO_2$, second dielectric member: $TiO_2$ first dielectric member: $SiO_2$, second dielectric member: $ZrO_2$ first dielectric member: $ZrO_2$, second dielectric member: $Al_2O_3$ first dielectric member: polytetrafluoroethylene, second dielectric member: polyethylene terephthalate For example, when a fluid is pure water with a pH7, the zeta potential of $SiO_2$ is about −50 mV, and that of $Al_2O_3$ is about +40 mV.

If the potential of the first electrode 121 and the third electrode 123 is negative and the potential of the second electrode 122 is positive, the material of the first dielectric member 131 and the third dielectric member 133 and that of the second dielectric member 132 are swapped with each other in each of the above-described combinations (for example, the first dielectric member 131 and the third dielectric member 133 are made of $Al_2O_3$ and the second dielectric member 132 is made of $SiO_2$).

The zeta potential ζ is defined in the following manner, for example. A planar-shape sample is made with the same condition and the same composition of a material as a subject dielectric member 13, and then, the planar-shape sample is immersed in a fluid to be used (that is, a fluid flowing through the pump flow path 11). Then, the zeta potential of the planar-shape sample immersed in the fluid is measured with a zeta potential measurer. The measuring result is defined as the zeta potential ζ.

A non-limiting example of a manufacturing method for the pump 10 will be described below. In the following example, a manufacturing method for the pump 10 shown in FIG. 5 including the electrodes 12 and outer electrodes 21 and 22 made of Pt and the dielectric members 13 made of $SiO_2$ and $Al_2O_3$ will be discussed.

For example, $SiO_2$ is used for making the first dielectric member 131 and the third dielectric member 133, while $Al_2O_3$ is used for making the second dielectric member 132. In this case, each of $SiO_2$ and $Al_2O_3$ is first subjected to dispersion processing in a ball mill for about eight hours, together with a toluene/ethanol mixed solvent, a dispersant, and a binder. Then, a $SiO_2$ ceramic green sheet which forms the first dielectric member 131 and the third dielectric member 133 and an $Al_2O_3$ ceramic green sheet which forms the second dielectric member 132 are formed by doctor blading, for example. During the manufacturing process, a sintering aid including $SiO_2$ is added to $SiO_2$ and a sintering aid including $Al_2O_3$ is added to $Al_2O_3$. The sintering aid is glass, such, for example, as $CaO$—$B_2O_3$—$SiO_2$, $ZnO$—$B_2O_3$—$SiO_2$, and $CaO$—$Al_2O_3$—$SiO_2$, or an oxide which forms a liquid phase during a firing step.

Then, the formed ceramic green sheets are covered with a mask, and Pt is vapor-deposited (or a Pt paste is applied), thus forming a plurality of electrodes 12 on each of the $SiO_2$ ceramic green sheet and the $Al_2O_3$ ceramic green sheet. Multiple pores for allowing a fluid to pass therethrough are formed in each electrode 12. The $SiO_2$ ceramic green sheet and the $Al_2O_3$ ceramic green sheet each with the electrodes 12 formed thereon are stacked on each other with a stacking machine and then are pressure-bonded to each other with a pressure-bonding machine. As a result, a multilayer body including the $SiO_2$ ceramic green sheet with the electrodes 12 formed thereon and the $Al_2O_3$ ceramic green sheet with the electrodes 12 formed thereon alternately stacked on each other is formed.

The electrodes 12 formed on each ceramic green sheet is considerably thin (about 1 μm, for example) and do not cover the pores formed in the ceramic green sheets. In the multilayer body, multiple through-holes extending in the stacking direction, which form the pump flow path 11, are formed.

Then, the formed multilayer body is cut with a dicing machine and is fired at about 800° C. to about 1000° C. The fired multilayer body is then covered with a mask and Pt is vapor-deposited to form the outer electrodes 21 and 22. Then, the pump 10 is manufactured.

Second Preferred Embodiment

A pump 10 according to a second preferred embodiment of the present invention is different from that of the first preferred embodiment in at least one of the following three points. In the second preferred embodiment, the same or corresponding elements as the first preferred embodiment are designated by the reference numerals and an explanation thereof will be omitted, and points different from the first preferred embodiment will be explained.

The porosity of the second dielectric member 132 (an example of the second dielectric member) is greater than that of the first dielectric member 131 and the third dielectric member 133 (an example of the first dielectric member).

The pore size of the second dielectric member 132 is larger than that of the first dielectric member 131 and the third dielectric member 133.

The tortuosity of the second dielectric member 132 is smaller than that of the first dielectric member 131 and the third dielectric member 133.

The influences produced by the relationships between the porosity, the pore size, and the tortuosity of the first dielectric member and those of the second dielectric member on the flow rate of the pump 10 will be discussed below.

Work $W_{single\ layer}$ done by a pump including one dielectric member having a radius r and a length L and a pair of electrodes at both ends of the dielectric member (hereinafter called a known pump) will be described. It is assumed that the dielectric member of the known pump is a porous medium having a pore size a, a porosity φ, and a tortuosity τ. Based on the following equation 2, the number N of pores of the dielectric member is expressed by the following equation 3 (the thicknesses of the electrodes are ignored).

$$\phi = (a^2 \pi N L \sqrt{\tau})/(r^2 \pi L) \qquad \text{Equation 2}$$

$$N = (r^2 \phi)/(a^2 \sqrt{\tau}) \qquad \text{Equation 3}$$

Figure 7:
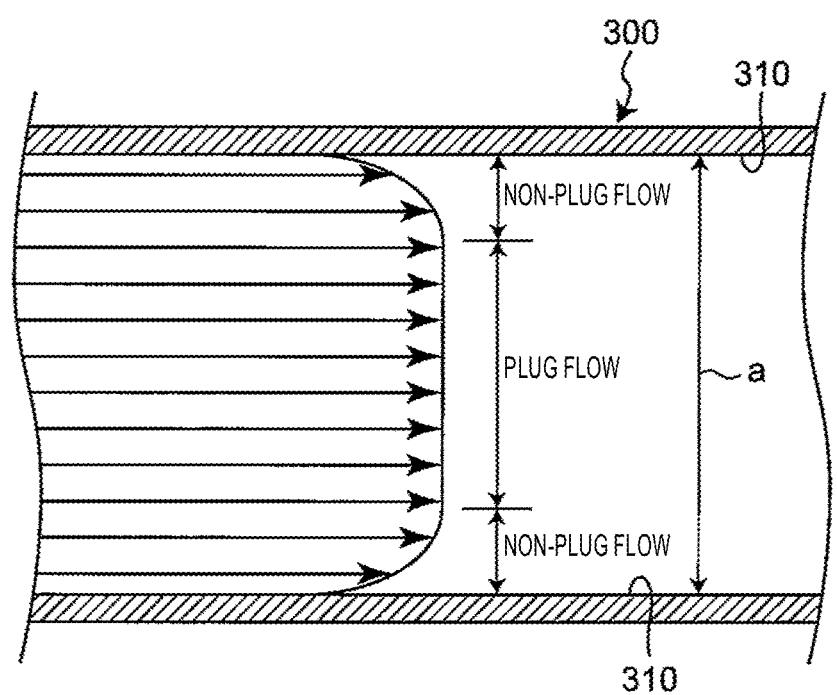
FIG. 7 is a view for explaining a pump according to a second preferred embodiment of the present invention.

It is assumed that the pore size a is much larger than the Debye length λ (the pore size a is, for example, fifty times or more as large as the Debye length λ). As shown in FIG. 7, an electroosmotic flow within a narrow pipe 300 having a pore size a which is much larger than the Debye length λ becomes a plug flow, and the velocity $u_\infty$ of the plug flow is expressed by the following equation 4. In equation 4, $\varepsilon_r$ is the relative dielectric constant of a fluid, $\varepsilon_0$ is the vacuum dielectric constant, μ is the viscosity of the fluid, $E_e$ is the electric field strength, and ζ is the zeta potential.

$$u_\infty = -\varepsilon_r \varepsilon_0 E_e \zeta / \mu \qquad \text{Equation 4}$$

According to equation 4, the velocity $u_\infty$ is determined by the balance between the zeta potential and the viscosity of the fluid. In other words, the velocity $u_\infty$ converges to the velocity at which the work done by the electrostatic attraction force acting on and near wall surfaces 310 of the narrow pipe 300 and the energy loss due to the friction force of a fluid are balanced.

Work W done by the pump is expressed by W=(work done by electrostatic attraction force)+(work done by friction force)=(electrostatic attraction force)×(distance)×S+(friction force)×(distance)×S, where S is the surface area of the pores of the dielectric member.

The distance is a distance by which fluid particles are moved for a short period of time and coincides with the flow velocity u. When the electrostatic attraction force is Fa and the friction force is Fb, work W is expressed by the following equation 5.

$$W = F_a \times u \times S + F_b \times u \times S \qquad \text{Equation 5}$$

The electrostatic attraction force Fa is proportional to the electric field E and the electric field E is inversely proportional to the effective inter-electrode distance $L\sqrt{\tau}$. The electrostatic attraction force Fa is thus expressed by the following equation 6 when the applied voltage is indicated by V. In equation 6, k is a constant of proportionality.

$$F_a = kE = kV/L\sqrt{\tau} \qquad \text{Equation 6}$$

The friction force Fb is proportional to the flow velocity u and acts in the direction opposite the flowing direction. The friction force Fb is thus expressed by the following equation 7, where b is a constant of proportionality.

$$F_b = -bu \qquad \text{Equation 7}$$

The relationship between the flow velocity u and the flow rate Q is expressed by the following equation 8. The surface area S of pores is expressed by the following equation 9.

$$u = Q/(a^2 \pi N) \qquad \text{Equation 8}$$

$$S = 2a\pi N \times L\sqrt{\tau} = 2\pi r^2 L\phi/a \qquad \text{Equation 9}$$

Work $W_{single\ layer}$ done by the known pump is expressed by the following equation 10 based on the above-described equations to 9. In equation 10, the first term on the right side corresponds to the work done by the electrostatic attraction force, and the second term on the right side corresponds to the work done by the friction force (energy loss).

$$\begin{aligned}W_{single\ layer} &= F_a \times u \times S + F_b \times u \times S \qquad \text{Equation 10}\\
&= (kV/L\sqrt{\tau}) \times (Q/a^2\pi N) \times (2\pi r^2 L\phi/a) + \\
&\quad (-bQ/a^2\pi N) \times (Q/a^2\pi N) \times (2\pi r^2 L\phi/a) \\
&= 2kVQ/a - (2bQ^2 L/\pi r^2) \times (\tau/a\phi)\end{aligned}$$

Work $W_{multilayer}$ done by the pump 10 shown in FIG. 5 will now be described. It is now assumed that, concerning the first dielectric member 131 and the third dielectric member 133, which are the first dielectric member, the pore size is $a_1$, the porosity is $\phi_1$, and the tortuosity is $\tau_1$, and that concerning the second dielectric member 132, which is the second dielectric member, the pore size is $a_2$, the porosity is $\phi_2$, and the tortuosity is $\tau_2$. Regarding the first dielectric member, the flow velocity is $u_1$, the electrostatic attraction force is $F_{a1}$, the friction force is $F_{b1}$, and the surface area of the pores is $S_1$. Regarding the second dielectric member, the flow velocity is $u_2$, the electrostatic attraction force is $F_{a2}$, the friction force is $F_{b2}$, and the surface area of the pores is $S_2$. If the length of each dielectric member is L/3, work $W_{multilayer}$ done by the pump 10 is expressed by the following equation 11. In equation 11, as well as in equation 10, the first term on the right side corresponds to the work done by the electrostatic attraction force, and the second term on the right side corresponds to the work done by the friction force.

$$\begin{aligned}W_{multilayer} &= (F_{a1} \times u_1 \times S_1 + F_{b1} \times u_1 \times S_1) + \qquad \text{Equation 11}\\
&\quad (F_{a2} \times u_2 \times S_2 + F_{b2} \times u_2 \times S_2) + \\
&\quad (F_{a1} \times u_1 \times S_1 + F_{b1} \times u_1 \times S_1) \\
&= 2 \times \{2kVQ/a_1 - (2bQ^2 L/3\pi r^2) \times \\
&\quad (\tau_1/a_1\phi_1)\} + \{-2kVQ/a_2 - \\
&\quad (2bQ^2 L/3\pi r^2) \times (\tau_2/a_2\phi_2)\} \\
&= 2kVQ \times (2/a_1 - 1/a_2) - (2bQ^2 L/3\pi r^2) \times \\
&\quad (2\tau_1/a_1\phi_1) + \tau_2/a_2\phi_2)\end{aligned}$$

According to the above-described equations 10 and 11, when $a_1=a_2$ and $\phi_1=\phi_2$ and $\tau_1=\tau_2$, $W_{multilayer}=W_{single\ layer}$. When $a_2>a_1$, the work done by the electrostatic attraction force in $W_{multilayer}$ becomes greater than that in $W_{single\ layer}$, and the absolute value of the work done by the friction force in $W_{multilayer}$ becomes smaller than that in $W_{single\ layer}$. When $\phi_2>\phi_1$ or $\tau_2<\tau_1$, the work done by the electrostatic attraction force in $W_{multilayer}$ is equal to that in $W_{single\ layer}$, but the absolute value of the work done by the friction force in $W_{multilayer}$ becomes smaller than that in $W_{single\ layer}$. Accordingly, as a result of setting the porosity $\phi_2$ of the second dielectric member to be greater than the porosity $\phi_1$ of the first dielectric member or setting the pore size $a_2$ of the second dielectric member to be greater than the pore size $a_1$ of the first dielectric member or setting the tortuosity $\tau_2$ of the second dielectric member to be smaller than the tortuosity $\tau_1$ of the first dielectric member, $W_{multilayer}$ becomes greater than $W_{single\ layer}$, so that the flow rate of the pump 10 becomes higher than that of the known pump. As a result, it is possible to provide the pump 10 using an electroosmotic flow that can improve the flow rate while ensuring the mechanical strength.

Figure 8:
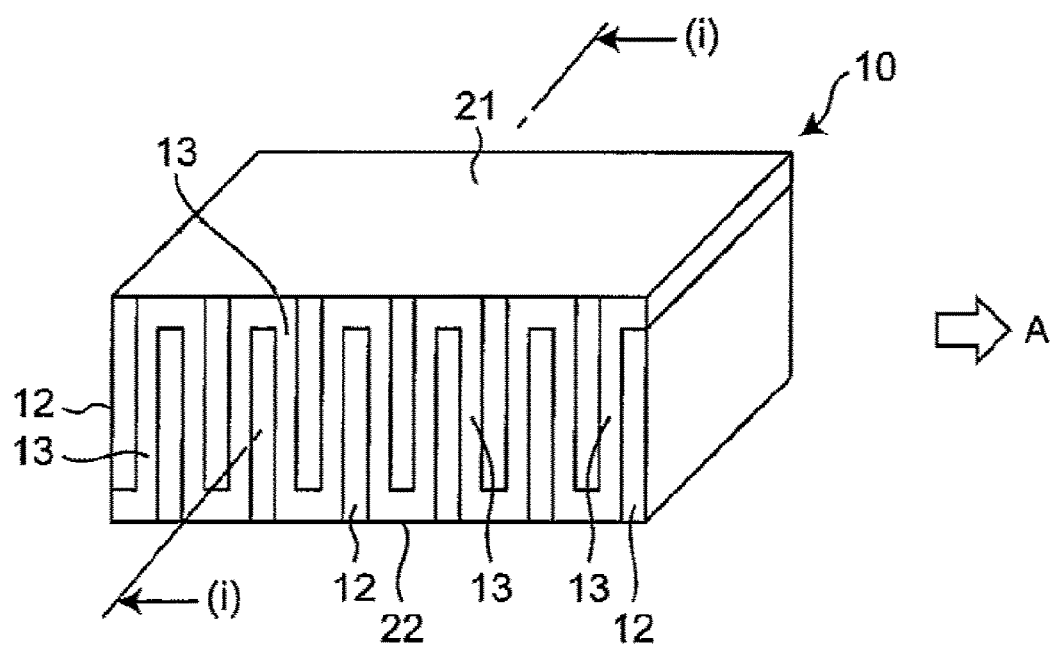
FIG. 8 is a perspective view for explaining the pump shown in FIG. 5.

The porosity $\phi$ is defined in the following manner, for example. A sectional surface passing through the center or approximate center of the flowing direction A of a subject dielectric member 13 and also being perpendicular or substantially perpendicular to the flowing direction A (sectional surface taken along (i)-(i) line in FIG. 8) is observed with an SEM (scanning electron microscope). The magnification factor is set so as to allow about 50 pores to enter the viewing field. Then, images of the subject dielectric member 13 in the viewing field are taken with a high contrast. While changing the viewing field, images of ten portions of the subject dielectric member 13 are taken, and the porosity is measured in each image. The average of the porosities obtained from the individual images is defined as the porosity $\phi$ of the subject dielectric member 13.

The pore size a is defined in the following manner, for example. A sectional surface passing through the center or approximate center of the flowing direction A of the subject dielectric member 13 and also being perpendicular or substantially perpendicular to the flowing direction A (sectional surface taken along (i)-(i) line in FIG. 8) is observed with an SEM (scanning electron microscope). The magnification factor is set so as to allow about 50 pores to enter the viewing field. Then, images of the subject dielectric member 13 in the viewing field are taken with a high contrast. While changing the viewing field, images of ten portions of the subject dielectric member 13 are taken, and the pore size (Feret diameter) is measured in each image. The average of the pore sizes obtained from the individual images is defined as the pore size a of the subject dielectric member 13.

The tortuosity τ is defined in the following manner, for example. A planar-shape sample is made with the same condition and the same composition of the material as the dielectric member 13, and electrodes cover the entirety or substantially the entirety of both surfaces of the planar-shape sample. Water is then caused to sufficiently permeate into the planar-shape sample, and in this state, the inter-electrode electrical resistance R is measured. Then, an electrode pair having the same or substantially the same electrode area and the same or substantially the same inter-electrode distance as the planar sample is prepared, and water is caused to permeate into this electrode pair. The inter-electrode electrical resistance $R_{ref}$ is then measured. When measuring the electrical resistance $R_{ref}$, water having the same electrical resistance as that for measuring the electrical resistance R is used so as to avoid the occurrence of measurement errors caused by a leakage of electric fields. The result obtained by the following equation 12 based on the measured electrical resistance R and the electrical resistance $R_{ref}$ is defined as the tortuosity τ.

$$\tau = \phi \times (R/R_{ref})$$ Equation 12

In equation 12, ϕ is the open porosity and is determined by Archimedes' principle (JIS R 1634:1998). It is assumed that the weight of a sample in the dry state (mass in the dry state) is w1, the weight of the sample immersed and saturated in water (mass in water) is w2, and the weight of the sample removed from water and wiped off water droplets on its surface (mass in the saturated state) is w3. In this case, the open porosity ϕ is obtained by the following equation 13.

$$\Psi = (w_3 - w_1)/(w_3 - w_2)$$ Equation 13

The manufacturing method for the pump 10 of the second preferred embodiment is different from that of the first preferred embodiment in that a ceramic green sheet forming the first dielectric member 131 and the third dielectric member 133 and that forming the second dielectric member 132 are formed by using different materials or different processes.

To make the porosity of the second dielectric member 132 greater than that of the first dielectric member 131 and the third dielectric member 133, the following materials, for example, are used. As the material for the first dielectric member 131 and the third dielectric member 133, $SiO_2$ powder having a particle size (D50) of about 1 μm is used. As the material for the second dielectric member 132, a material obtained by mixing $SiO_2$ powder having a particle size (D50) of about 2 μm and $SiO_2$ powder having a particle size (D50) of about 0.2 μm at a weight ratio of 1:1 is used.

To make the pore size of the second dielectric member 132 greater than that of the first dielectric member 131 and the third dielectric member 133, the following materials, for example, are used. As the material for the first dielectric member 131 and the third dielectric member 133, $SiO_2$ powder having a particle size (D50) of about 1 μm is used. As the material for the second dielectric member 132, $SiO_2$ powder having a particle size (D50) of about 10 μm is used. The pore size a is preferably 10 nm or greater, and more preferably, about 0.1 μm to 10 μm, for example. If the pore size is smaller than about 10 nm, layers forming the electrical double layer formed on the wall surfaces 310 (see FIG. 7) overlap each other due to an excessively small pore size a, which may decrease the pumping efficiency.

To make the tortuosity of the second dielectric member 132 smaller than that of the first dielectric member 131 and the third dielectric member 133, the following processes and materials, for example, are used. For the first dielectric member 131 and the third dielectric member 133, the following material and process are used. $SiO_2$ is subjected to dispersion processing in a ball mill for about eight hours, together with a toluene/ethanol mixed solvent, a dispersant, and a binder. Then, ceramic green sheets having different thicknesses are formed by doctor blading. The formed ceramic green sheets are irradiated with laser light or subjected to track etching, thus forming pores. For the second dielectric member 132, the following material and process are used. Resin beads (a diameter of about 1 μm, for example) and $SiO_2$ are subjected to dispersion processing in a ball mill for about eight hours, together with a toluene/ethanol mixed solvent, a dispersant, and a binder. Then, ceramic green sheets having different thicknesses are formed by doctor blading. In the first dielectric member 131 and the third dielectric member 133, straight or substantially straight pores are formed. In the second dielectric member 132, curved pores are formed. During the manufacturing process, a sintering aid including $SiO_2$ is added to $SiO_2$. The sintering aid is glass, such as $CaO-B_2O_3-SiO_2$, $ZnO-B_2O_3-SiO_2$, and $CaO-Al_2O_3-SiO_x$ or an oxide which forms a liquid phase during a firing step, for example.

First Example

Figure 9:
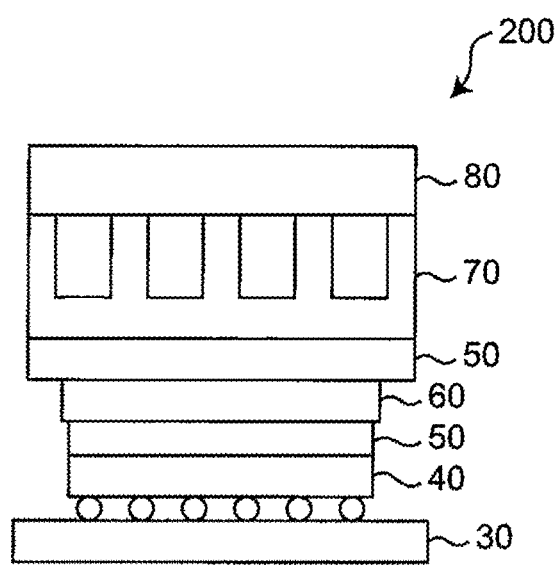
FIG. 9 is a schematic view illustrating the configuration of a cooling system of an example of a preferred embodiment of the present invention.

A cooling system 200 shown in FIG. 9 was provided in which a thermal paste 50, a cooling substrate 60, a thermal paste 50, a heat think 70, and a cooling fan 80 are stacked in this order on an IC (integrated circuit) 40 mounted on a substrate 30. By using the cooling system 200, the maximum temperature T of the IC 40 was measured.

More specifically, for the cooling substrate 1 according to the first preferred embodiment, the number of dielectric members 13 of the pump 10 of the first preferred embodiment was variously changed in a range of 2 to 30 so as to provide a plurality of cooling substrates 1. As the cooling substrate 60, one of the cooling substrates 1 was used. Then, the maximum temperature T of the IC 40 with the use of the cooling substrate 60 and the maximum temperature T0 of the IC 40 with the use of a known cooling substrate (that is, a pump including one dielectric member and a pair of electrodes at both ends of the dielectric member) were measured. The individual pumps 10 in the cooling substrates 1 had the same or substantially the same shape and size.

Figure 10:
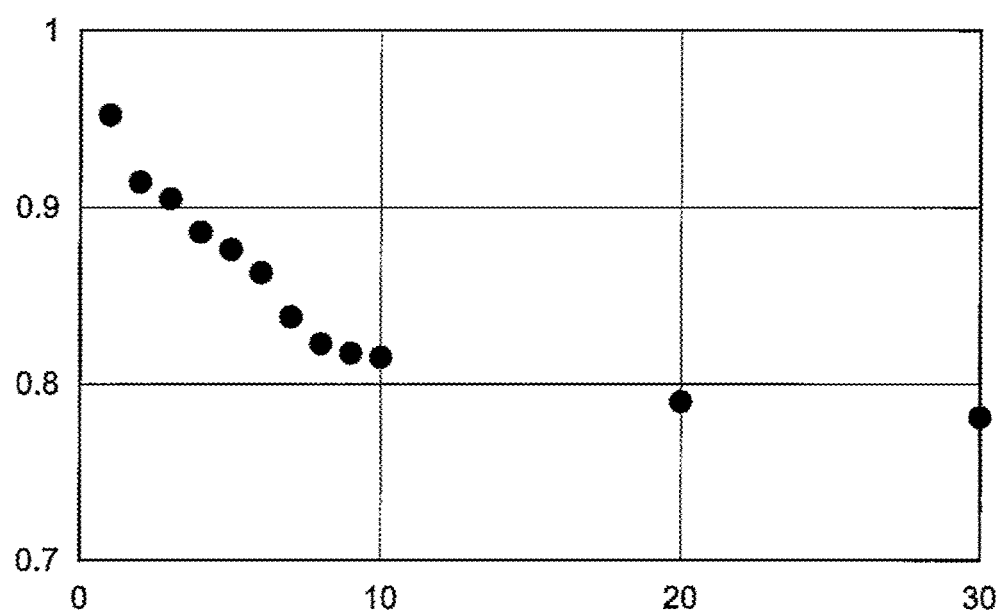
FIG. 10 is a graph illustrating the relationship between the maximum temperature of an IC using a known cooling substrate and that of an IC using a cooling substrate according to a preferred embodiment of the present invention including the pump shown in FIG. 5.

The relationship between the maximum temperature T0 of the IC 40 with the use of the known cooling substrate and the maximum temperature T of the IC 40 with the use of the cooling substrate 1 according to the first preferred embodiment is shown in FIG. 10. In FIG. 10, the vertical axis indicates the ratio (that is, the relative temperature) of the maximum temperature T of the IC 40 with the use of the cooling substrate 1 according to the first preferred embodiment to the maximum temperature T0 of the IC 40 with the use of the known cooling substrate, while the horizontal axis indicates the number of dielectric members 13 of the pump 10.

The measurement results in FIG. 10 show that the maximum temperature T of the IC 40 with the use of the cooling substrate 1 is lower than the maximum temperature T0 of the IC 40 with the use of the known cooling substrate. The measurement results also show that, with the use of the cooling substrate 1 according to the first preferred embodiment, as more dielectric members 13 are used, the maximum temperature T of the IC 40 becomes lower if the number of dielectric members 13 is thirty or less. Especially when the number of dielectric members 13 is ten or less, a higher cooling effect is achieved by using the cooling substrate of the first preferred embodiment than by using the known cooling substrate.

Figure 11:
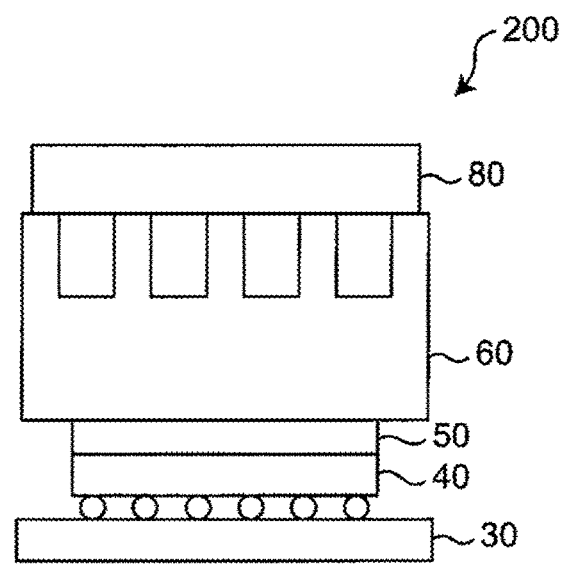
FIG. 11 is a schematic view illustrating a first modified example of the cooling system shown in FIG. 9.

In the cooling system 200, the cooling substrate 60 may be integrated with the heat sink 70 and define and function as the heat sink 70, as shown in FIG. 11. With this configuration, a small-size cooling system 200 is provided.

Figure 12:
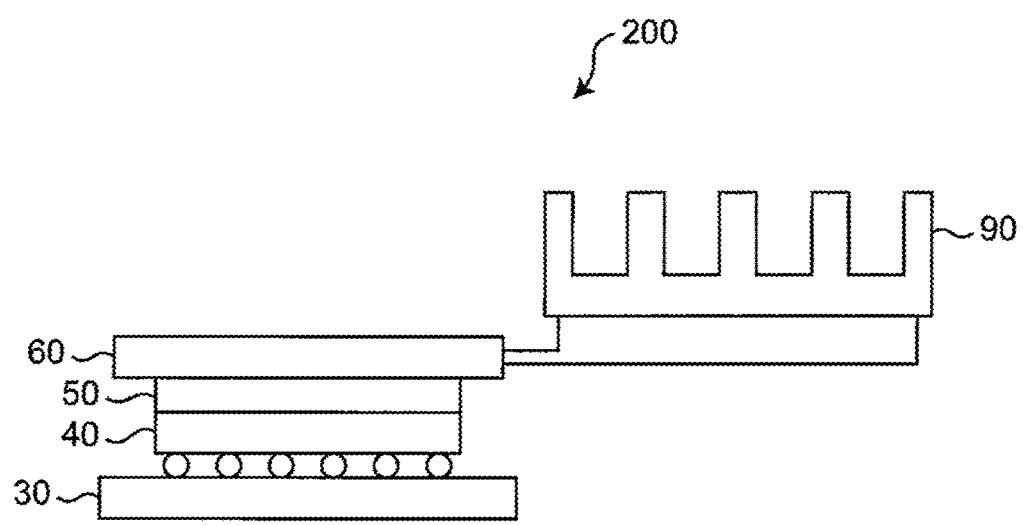
FIG. 12 is a schematic view illustrating a second modified example of the cooling system shown in FIG. 9.

Additionally, in the cooling system 200, as shown in FIG. 12, instead of the heat sink 70 and the cooling fan 80, a heat exchanger 90, which is provided separately from the IC 40, may be provided to cool a fluid in the cooling substrate 60. As a result of providing the heat exchanger 90 separately from the IC 40, the shape, size, and position of the heat exchanger 90 are less restricted. Compared with the cooling systems 200 shown in FIGS. 9 and 11, the use of the heat exchanger 90 having a high cooling capacity can significantly improve the cooling capacity of the cooling substrate 60. Thus, the cooling system 200 shown in FIG. 12 is applicable to a heat source generating a greater amount of heat.

Among the above-described preferred embodiments and modified examples thereof, preferred embodiments or modified examples thereof may be suitably combined to achieve the corresponding advantages. As well as a combination of preferred embodiments, that of examples, or that of a preferred embodiment and an example, some features of different preferred embodiments or different examples may also be combined.

Preferred embodiments of the present invention are applicable to IC cooling systems, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A pump comprising:
a pump flow path through which a fluid flows; and
a plurality of electrodes and a plurality of dielectric members disposed in the pump flow path so as to allow a fluid to pass through the plurality of electrodes and the plurality of dielectric members in a flowing direction of the fluid; wherein
each of the plurality of electrodes and each of the plurality of dielectric layers includes two main surfaces opposing each other in the flowing direction;
the plurality of electrodes and the plurality of dielectric members are alternately stacked on each other with the main surfaces of the plurality of electrodes and the main surfaces of the plurality of dielectric layers in contact with each other in the flowing direction so that, among the plurality of dielectric members, a dielectric member is located between adjacent electrodes of the plurality of electrodes in the flowing direction; among the plurality of electrodes, an inter-electrode polarity of each pair of electrodes is different from an inter-electrode polarity of an adjacent pair of electrodes;
the plurality of dielectric members include:
a first dielectric member disposed at a position of an odd-numbered dielectric member counted from a most upstream side of the flowing direction; and
a second dielectric member disposed at a position of an even-numbered dielectric member counted from the most upstream side of the flowing direction;
a material from which the first dielectric member is made and a material from which the second dielectric member is made are materials that provide a sign of a zeta potential of the first dielectric member in the flowing direction and a sign of a zeta potential of the second dielectric member in the flowing direction that are opposite to each other.

2. The pump according to claim 1, further comprising outer electrodes that connect the plurality of electrodes with each other via surfaces linking the main surfaces of the plurality of electrodes.

3. The pump according to claim 1, wherein the fluid is water.

4. The pump according to claim 1, wherein the fluid is water to which an additive is added.

5. The pump according to claim 4, wherein the additive is at least one of a buffer solution, an antifreeze, and a corrosion resistant agent.

6. The pump according to claim 1, wherein a thickness of each of the plurality of electrodes in the flowing direction is larger than a thickness of each of the plurality of dielectric members in the flowing direction.

7. The pump according to claim 1, wherein the first dielectric member is made of $SiO_2$ and the second dielectric member is made of $Al_2O_3$, or the first dielectric member is made of $TiO_2$ and the second dielectric member is made of $Al_2O_3$, or the first dielectric member is made of $SiO_2$ and the second dielectric member is made of $TiO_2$, or the first dielectric member is made of $SiO_2$ and the second dielectric member is made of $ZrO_2$, or the first dielectric member is made of $ZrO_2$ and the second dielectric member is made of $Al_2O_3$, or the first dielectric member is made of polytetrafluoroethylene and the second dielectric member is made of polyethylene terephthalate.

8. A cooling substrate comprising:
a substrate flow path with a fluid filled in the substrate flow path and flowing through the substrate flow path; and
the pump according to claim 1; wherein
the pump is disposed in the substrate flow path; and
the pump flow path is connected to the substrate flow path.

9. A cooling substrate comprising:
a substrate flow path with a fluid filled in the substrate flow path and flowing through the substrate flow path; and
the pump according to claim 5; wherein
the pump is disposed in the substrate flow path; and
the pump flow path is connected to the substrate flow path.

* * * * *